United States Patent
Kang et al.

(10) Patent No.: US 7,366,050 B2
(45) Date of Patent: Apr. 29, 2008

(54) APPARATUS AND METHOD FOR DATA OUTPUTTING

(75) Inventors: Tae-Jin Kang, Ichon-shi (KR); Bong-Hwa Jeong, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 191 days.

(21) Appl. No.: 11/178,561

(22) Filed: Jul. 12, 2005

(65) Prior Publication Data

US 2005/0243614 A1    Nov. 3, 2005

(30) Foreign Application Priority Data

Feb. 4, 2005    (KR) .................. 10-2005-0010660

(51) Int. Cl.
*G11C 8/00*    (2006.01)
(52) U.S. Cl. ............ 365/230.06; 365/233; 365/189.11; 365/189.12
(58) Field of Classification Search ........... 365/230.06, 365/233, 189.11, 189.12
See application file for complete search history.

(56) References Cited

U.S. PATENT DOCUMENTS

| | | | |
|---|---|---|---|
| 6,262,940 B1 | 7/2001 | Choi et al. | |
| 6,707,758 B2 * | 3/2004 | Kono | 365/233 |
| 6,735,128 B2 * | 5/2004 | Kim | 365/189.05 |
| 6,741,499 B2 | 5/2004 | Imamiya et al. | |
| 6,807,598 B2 | 10/2004 | Farmwald et al. | |
| 6,965,532 B2 * | 11/2005 | Shim | 365/194 |
| 6,982,924 B2 * | 1/2006 | Na | 365/233 |
| 7,081,784 B2 * | 7/2006 | Kang | 327/291 |

FOREIGN PATENT DOCUMENTS

| | | |
|---|---|---|
| JP | 1998-0041240 | 8/1998 |
| JP | 1999-0049422 | 7/1999 |
| JP | 11-297089 | 10/1999 |
| JP | 2001-0001583 | 1/2001 |
| TW | 591658 | 7/2001 |
| TW | 588379 | 3/2002 |
| TW | 588380 | 3/2003 |

OTHER PUBLICATIONS

Taiwanese Office Action issued in Taiwanese Patent Application No. TW 094123620, mailed May 4, 2007.

* cited by examiner

*Primary Examiner*—Anh Phung
*Assistant Examiner*—Toan Le
(74) *Attorney, Agent, or Firm*—McDermott Will & Emery LLP (57) ABSTRACT

An data output circuit for outputting a data stored in a core of a semiconductor memory device includes a clock generator for generating a rising clock and a falling clock by using an external clock, a clock repeater for outputting the rising clock and the falling clock as one of a high voltage clock and a low voltage clock in response to an external voltage level check signal, a level shifter for outputting a high voltage data generated by shifting the data synchronized with the high voltage clock, a data carrier for outputting a low voltage data synchronized with the low voltage clock, and a data repeater for outputting one of the high voltage data and the low voltage data in response to the external voltage level check signal.

29 Claims, 9 Drawing Sheets

APPARATUS AND METHOD FOR DATA OUTPUTTING

FIELD OF INVENTION

The present invention relates to a semiconductor memory device; and, more particularly, to a data output circuit for increasing a data processing speed of the semiconductor memory device.

DESCRIPTION OF PRIOR ART

Because a level of a data transmitted from a core block of a semiconductor memory device is usually not enough to make peripheral devices work correctly, most semiconductor memory devices include a data output circuit which raises the level of the data up to a predetermined voltage level.

Figure 1:
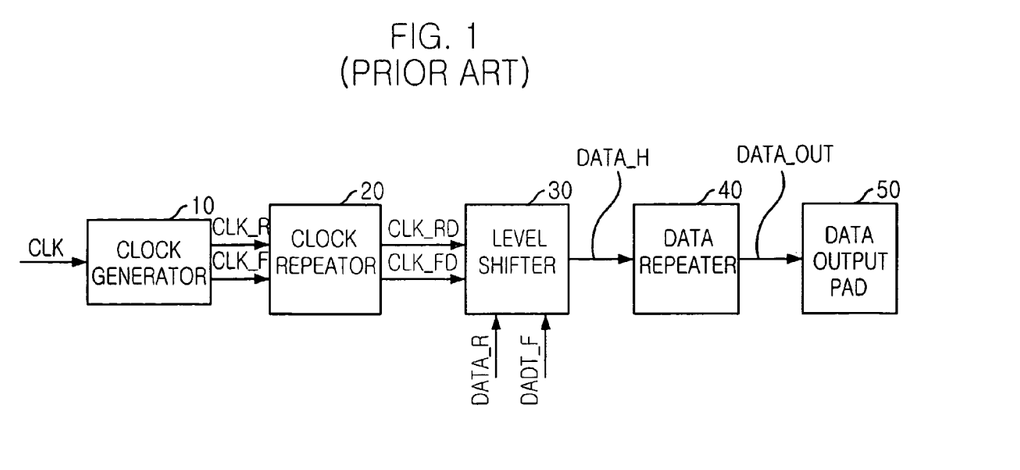
FIG. 1 is a block diagram describing a conventional data output circuit of a semiconductor memory device.

FIG. 1 is a block diagram describing a conventional data output circuit for use in a semiconductor memory device.

As shown, the data output circuit includes a clock generator 10, a clock repeater 20, a level shifter 30, a data repeater 40, and a data output pad 50.

The clock generator 10 generates a rising clock CLK_R and a falling clock CLK_F in response to an external clock CLK. The clock repeater 20 delays the rising clock CLK_R and the falling clock CLK_F for a predetermined time to thereby output a delayed rising clock CLK_RD and a delayed falling clock CLK_FD when the semiconductor memory device operates in normal mode. The level shifter 30 raises levels of a rising data DATA_R and a falling data DATA_F up to a predetermined voltage level by using the delayed rising clock CLK_RD and the delayed falling clock CLK_FD outputted from the clock repeater 20 to output a high voltage data DATA_H. The rising data DATA_R and the falling data DATA_F are outputted from the level shifter 30 synchronized with the delayed rising clock CLK_RD and the delayed falling clock CLK_FD, respectively. The data repeater 40 latches the high voltage data DATA_H to output an output data DATA_OUT to the data output pad 50.

Figure 2:
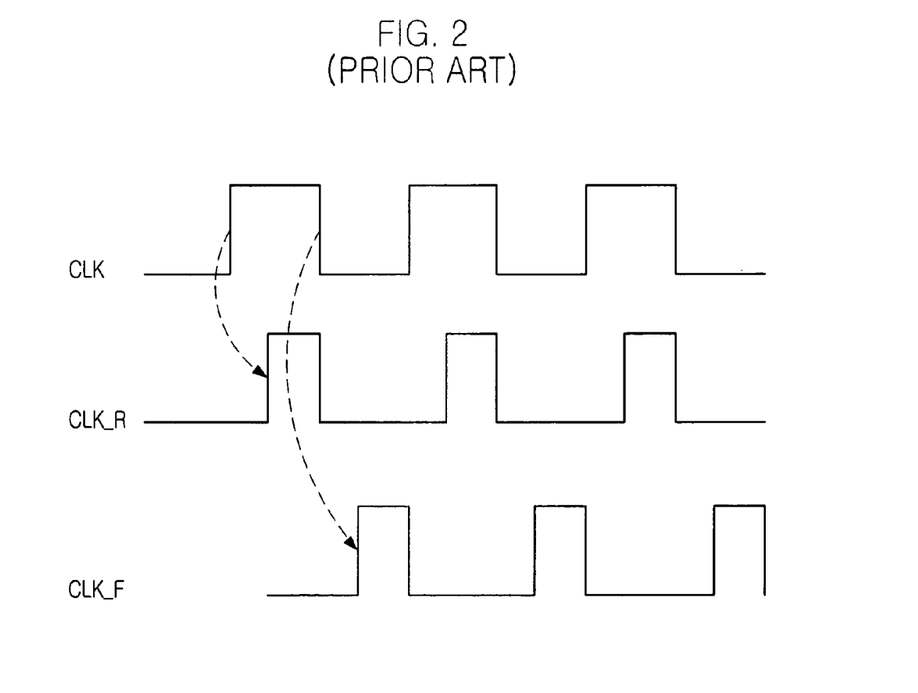
FIG. 2 is a timing diagram showing an operation of a clock generator shown in FIG. 1.

FIG. 2 is a timing diagram showing an operation of the clock generator 10 shown in FIG. 1.

As shown, the clock generator 10 generates the rising clock CLK_R in response to a rising edge of the external clock CLK and generates the falling clock CLK_F in response to a falling edge of the external clock CLK.

Figure 3A:
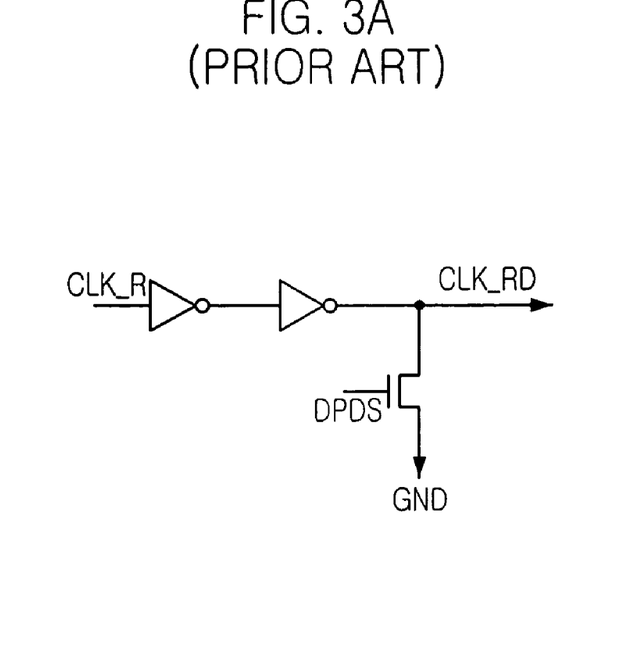
FIGS. 3A and 3B are schematic diagrams depicting a clock repeater shown in FIG. 1.
Figure 3B:
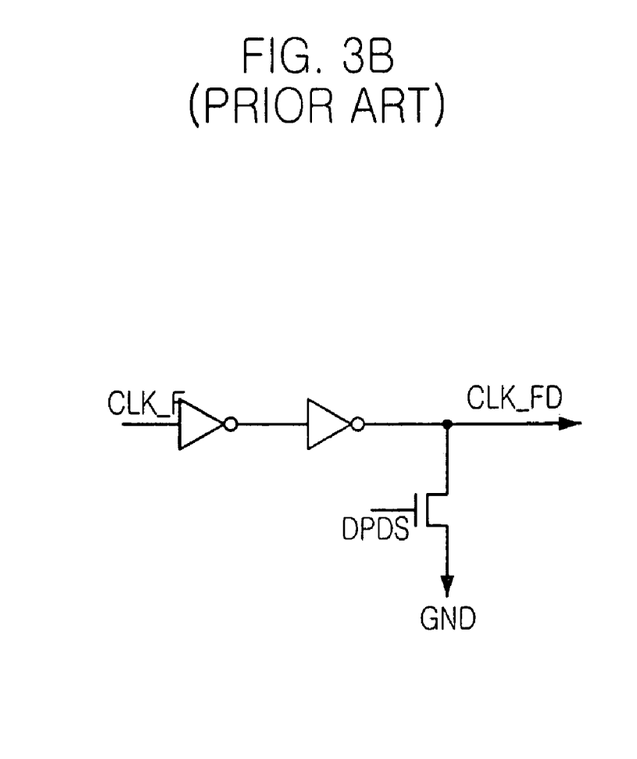

FIGS. 3A and 3B are schematic diagrams depicting the clock repeater 20 shown in FIG. 1.

As abovementioned, when the semiconductor memory device operates in normal mode, the clock repeater 20 delays the rising clock CLK_R and the falling clock CLK_F to output the delayed rising clock CLK_RD and the delayed falling clock CLK_FD. In the mean time, when the semiconductor memory device enters into a deep power down mode, an initializing signal DPDS is activated into a logic level 'H'. The delayed rising clock CLK_RD and the delayed falling clock CLK_FD are not outputted from the clock repeater 20 in response to the initializing signal DPDS activated into the logic level 'H' to thereby reduce a power consumption.

Figure 4:
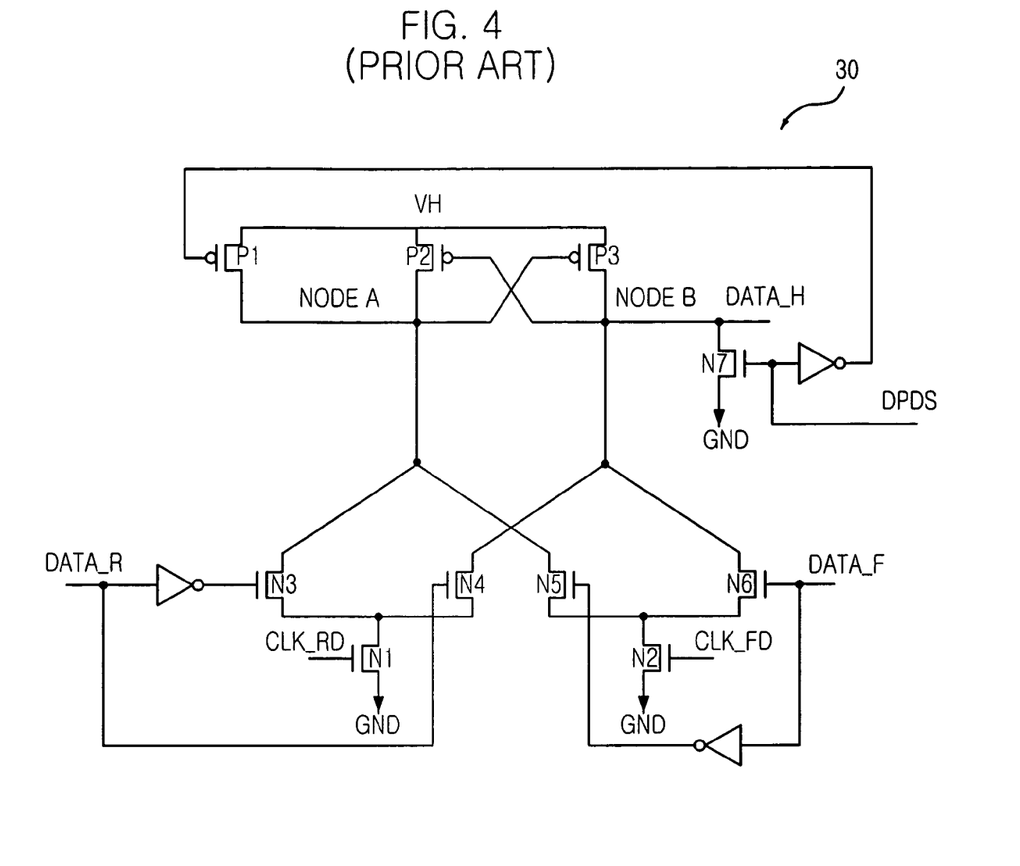
FIG. 4 is a schematic circuit diagram demonstrating a level shifter shown in FIG. 1.

FIG. 4 is a schematic circuit diagram describing the level shifter 30 shown in FIG. 1.

When the semiconductor memory device operates in a normal mode, the initializing signal DPDS is inactivated, i.e., has a low logic level 'L'. Therefore, a first PMOS transistor P1 and a seventh NMOS transistor N7 of a differential amplifier, whose gate are receives the initializing signal DPDS, are turned-off; and one of the delayed rising clock CLK_RD and the delayed falling clock CLK_FD is supplied to the differential amplifier.

Hereinafter, in case of receiving the delayed rising clock CLK_RD, an operation of the level shifter 30 is explained.

First, when the delayed rising clock CLK_RD of a logic high level 'H' and the rising data DATA_L are inputted to the level shifter 30, first and fourth NMOS transistors N1 and N4 are turned-on and a third NMOS transistor N3 is turned-off. Accordingly, a voltage level of a second node B is lowered into a level of a ground voltage GND, and a second PMOS transistor P2 is turned-on. A voltage level of a first node A is raised to a level of a high voltage VH.

Secondly, when a logic level of the delayed rising clock CLK_RD is a logic level 'H' and a logic level of the rising data DATA_R is a logic level 'L', the first and third NMOS transistors N1 and N3 are turned-on and the fourth NMOS transistor N4 is turned-off. Accordingly, the level of the first node A is lowered into the level of the ground voltage GND, and a third PMOS transistor P3 is turned-on. Then, the voltage level of the second node B is raised to the level of the high voltage VH.

Meanwhile, if the level of the delayed rising clock CLK_RD is changed into a logic level 'L', the first NMOS transistor N1 is turned-off and the state of the other MOS transistors, e.g., the third and fourth NMOS transistors N3 and N4 and the second and third PMOS transistors P2 and P3 are not changed. Then, the high voltage data DATA_H is outputted to the data repeater 40.

Figure 5:
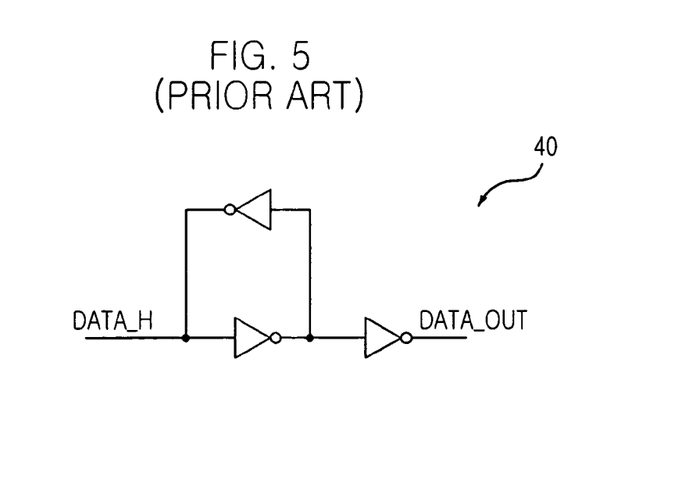
FIG. 5 is a schematic circuit diagram depicting a data repeater shown in FIG. 1.

FIG. 5 is a schematic circuit diagram demonstrating the data repeater 40 shown in FIG. 1.

As shown, the data repeater 40 latches the high voltage data DATA_H to output the output data DATA_OUT to the data output pad 50.

In the conventional data output circuit, the clock generator 10 and the clock repeater 20 use a low operational voltage; but the level shifter 30 and the data repeater 40 use a high operational voltage. Therefore, it may be impossible to perform a data processing operation rapidly.

In other words, because the clock generator 10 and the clock repeater 20 use the low operational voltage, they includes transistor for low operational voltage; similarly, because the level shifter 30 and the data repeater 40 use the high operational voltage, the level shifter 30 and the data repeater includes transistors for the high operational voltage. If transistors for the low operational voltage are used for a predetermined circuit using the high operational voltage, there occurs a leakage current in the transistors and, further, an oxide layer of the transistors may be broken down. If transistors for high operational voltage are used for a predetermined circuit using the low operational voltage, it is hard to obtain a rapid operational speed.

SUMMARY OF INVENTION

It is, therefore, an object of the present invention to provide a data output circuit that outputs a data rapidly by using both a high operational voltage and a low operational voltage.

In accordance with an aspect of the present invention, there is provided a data output circuit for outputting a data output circuit for outputting a data stored in a core block of a semiconductor memory device including a clock generator for generating a rising clock and a falling clock by using an external clock; a clock repeater for outputting the rising clock and the falling clock as one of a high voltage clock and a low voltage clock in response to an external voltage level check signal; a first block for outputting the data by using the high voltage clock; and a second block for outputting the data by using the low voltage clock.

In accordance with another aspect of the present invention, there is provided a data output circuit for outputting a data stored in a core block of the semiconductor memory device, including a clock generator for generating a rising clock and a falling clock by using an external clock; a clock repeater for outputting the rising clock and the falling clock as one of a high voltage clock and a low voltage clock in response to an external voltage level check signal; a level shifter for outputting a high voltage data generated by shifting the data synchronized with the high voltage clock; a data carrier for outputting a low voltage data synchronized with the low voltage clock; and a data repeater for outputting one of the high voltage data and the low voltage data in response to the external voltage level check signal.

In accordance with still another aspect of the present invention, there is provided a data output method for outputting a data stored in a core block of the semiconductor memory device, including the steps of: (a) generating a rising clock and a falling clock by using an external clock; (b) outputting the rising clock and the falling clock as one of a high voltage clock and a low voltage clock in response to an external voltage level check signal; (c) outputting the data by using the high voltage clock; and (d) outputting the data by using the low voltage clock.

In accordance with still further another aspect of the present invention, there is provided a data output method for outputting a data stored in a core block of a semiconductor memory device, including the steps of: (a) generating a rising clock and a falling clock by using an external clock; (b) outputting the rising clock and the falling clock as one of a high voltage clock and a low voltage clock in response to an external voltage level check signal; (c) outputting a high voltage data by shifting the data synchronized with the high voltage clock; (d) outputting a low voltage data by shifting the data synchronized with the low voltage clock; and (e) outputting one of the high voltage data and the low voltage data in response to the external voltage level check signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a data output circuit for use in a semiconductor memory device in accordance with the present invention will be described in detail referring to the accompanying drawings.

Figure 6:
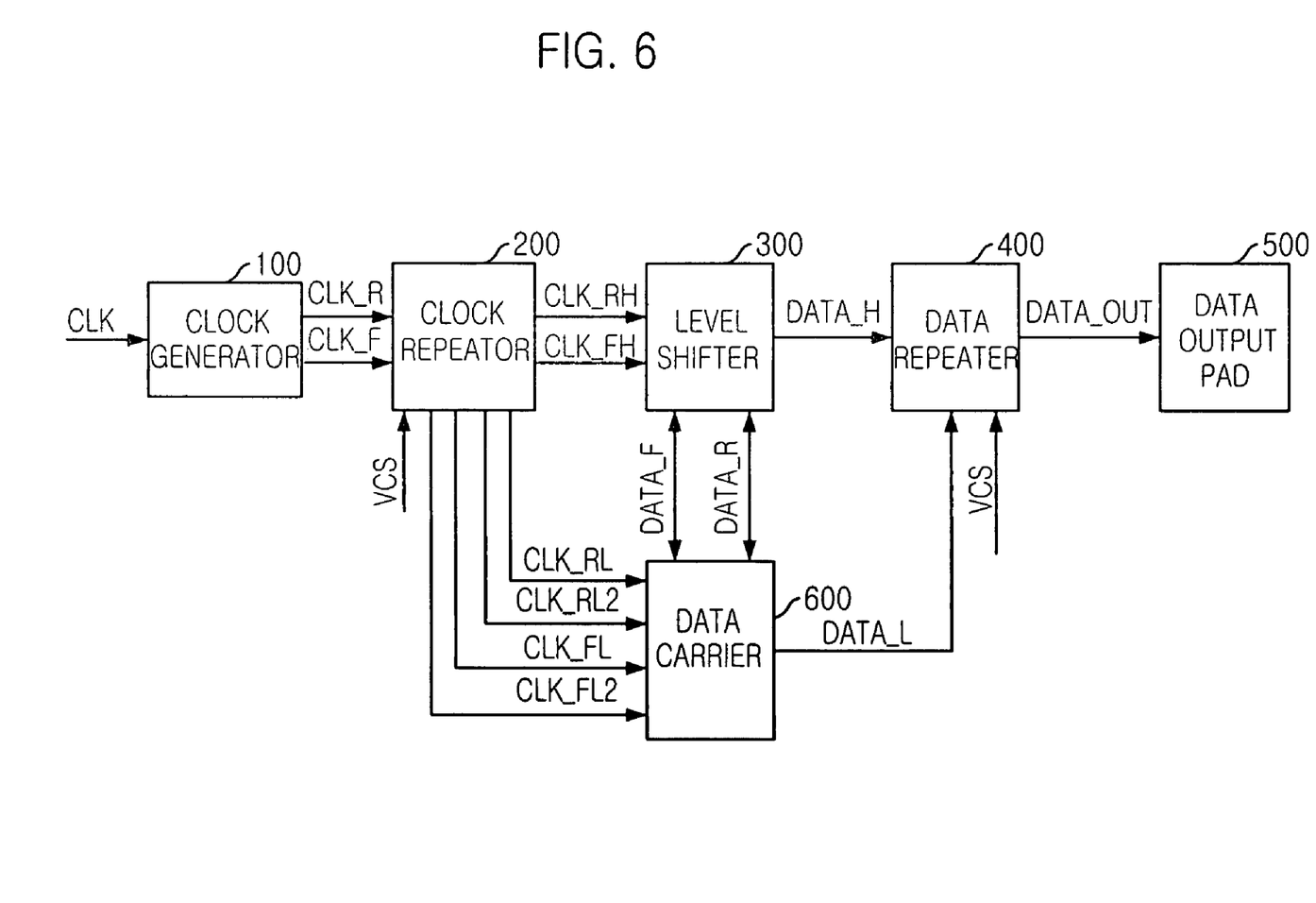
FIG. 6 is a block diagram describing a data output circuit in accordance with a preferred embodiment of the present invention.

FIG. 6 is a block diagram describing a data output circuit in accordance with a preferred embodiment of the present invention.

As shown, the data output circuit includes a clock generator 100, a clock repeater 200, a level shifter 300, a data repeater 400, a data output pad 500, and a data carrier 600.

Herein, the clock generator 100 and the level shifter 300 are same with the clock generator 10 and the level shifter 30 shown in FIG. 1. Therefore, a detailed explanation about the blocks performing the same operation is omitted.

Figure 7A:
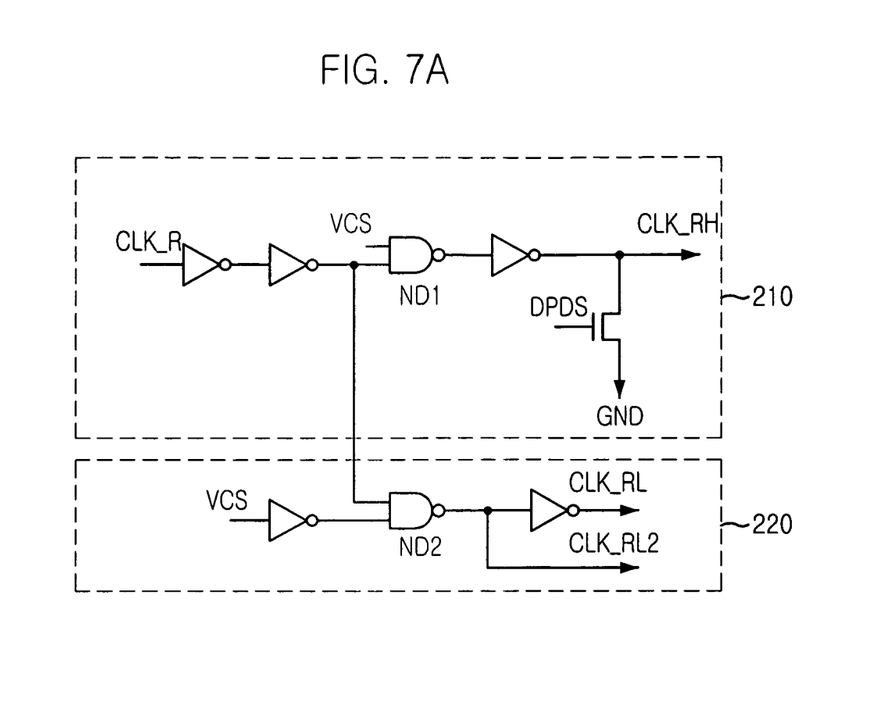
FIGS. 7A and 7B are schematic circuit diagrams depicting a clock repeater shown in FIG. 6.
Figure 7B:
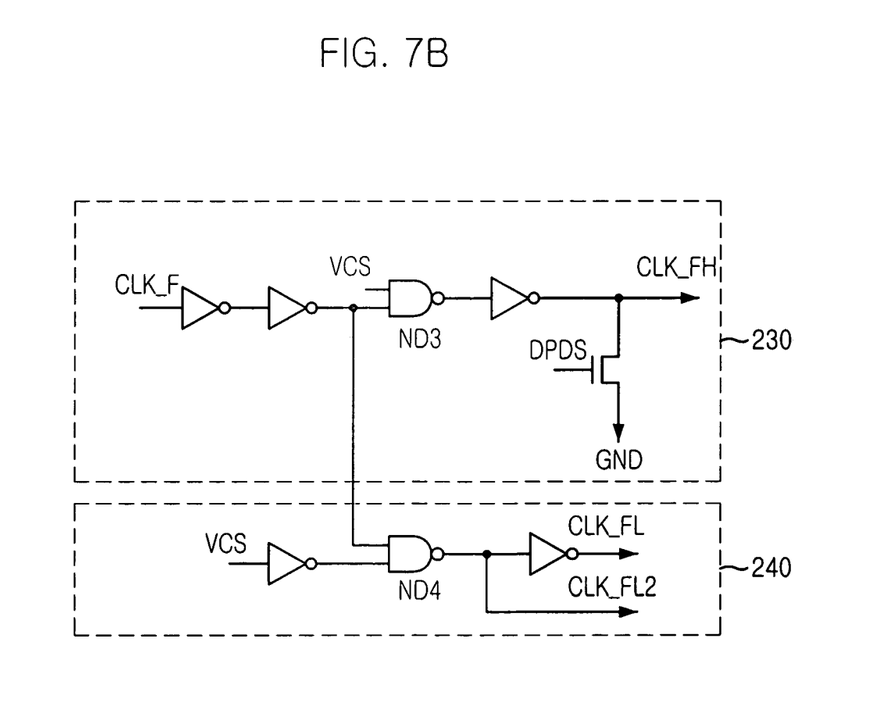

FIGS. 7A and 7B are schematic circuit diagrams depicting the clock repeater 200 shown in FIG. 6.

As shown, the clock repeater 200 is provided with a rising clock repeater and a falling clock repeater. The rising clock repeater illustrated in FIG. 7A includes a high voltage rising clock repeater 210 (hereinafter, referred as HVRC repeater) and a low voltage rising clock repeater 220 (hereinafter, referred as LVRC repeater). The falling clock repeater shown in FIG. 7B includes a high voltage falling clock repeater 230 (hereinafter, referred as HVFC repeater) and a low voltage falling clock repeater 240 (hereinafter referred as LVFC repeater).

A voltage level check signal VCS is inputted to the clock repeater 200 in order to detect an operation mode of the semiconductor memory device. In other words, when the semiconductor memory device operates in a high voltage operation, a level of the voltage level check signal VCS is a logic level 'H'; and when the semiconductor memory device operates in a low voltage operation, the level of the voltage level check signal VCS is a logic level 'L'.

If the voltage level check signal VCS of logic level 'H' is inputted to the rising clock repeater, a first input of a first NAND gate of the HVRC repeater 210 is a logic level 'H' and a first input of a second NAND gate of the LVRC repeater 220 is a logic level 'L'. Accordingly, a high voltage rising clock CLK_RH is enabled. The level of the voltage level check signal VCS is user controllable through a bonding option.

On the other hand, if the voltage level check signal VCS having a logic level 'L' is inputted to the rising clock repeater, the first input of the first NAND gate in the HVRC repeater 210 is a logic level 'L' and the first input of the second NAND gate in the LVRC 220 is a logic level 'H'. Accordingly, a low voltage rising clock CLK_RL is enabled.

Operations of the HVFC 230 and the LVFC 240 in the falling clock repeater are same with those of the HVRC 210 and LVRC 220 in the rising clock repeater.

Meanwhile, the level shifter 300 of the present invention is same with that shown in FIG. 1.

Figure 8:
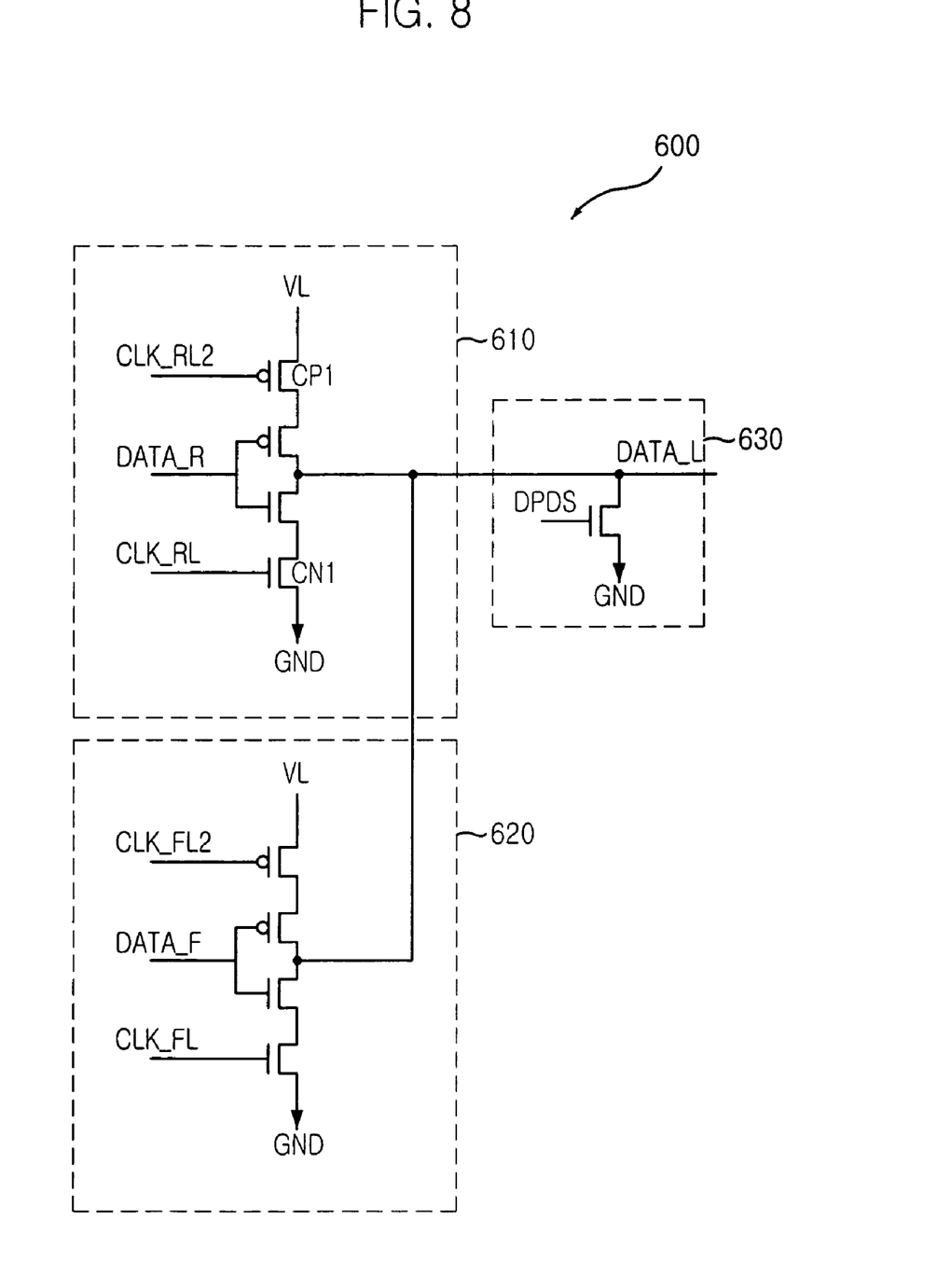
FIG. 8 is a schematic circuit diagram depicting a data carrier shown in FIG. 6.

FIG. 8 is a schematic circuit diagram depicting the data carrier 600 shown in FIG. 6.

As shown, the data carrier 600 includes a low voltage rising data transmitting unit 610, a low voltage falling data transmitting unit 620, and a low voltage initializing unit 630.

The low voltage rising data transmitting unit 610 outputs a rising data DATA_R in response to the low voltage rising clock CLK_RL. The low voltage falling data transmitting unit 620 outputs a falling data DATA_F in response to the low voltage falling clock CLK_FL. The low voltage initializing unit 630 keeps a low voltage output data DATA_L from outputting from the data carrier 600 when a level of an initializing signal DPDS is a logic level 'H'. In other words, if the semiconductor memory device operates in a deep power down mode, the data carrier 600 does not output the low voltage output data DATA_L in order to reduce a power consumption.

Looking at an operation of the data carrier 600, when the low voltage rising clock CLK_RL having a logic level 'H' and an inverse low voltage rising clock CLK_RL2 having a logic level 'L' are inputted to the data carrier 600, a first carrier PMOS transistor CP1 and a first carrier NMOS transistor CN1 are turned-on. Accordingly, the rising data DATA_R is outputted as the low voltage data DATA_L.

On the other hand, when the low voltage rising clock CLK_RL having a logic level 'L' and the inverse low voltage rising clock CLK_RL2 having a logic level 'H' are inputted to the data carrier 600, the first carrier PMOS transistor CP1 and the first carrier NMOS transistor CN1 are turned-off, and the low voltage data DATA_L is not outputted from the data carrier 600.

Meanwhile, an operation of the low voltage falling data transmitting unit 620 is substantially identical to the low voltage rising data transmitting unit 610.

Figure 9:
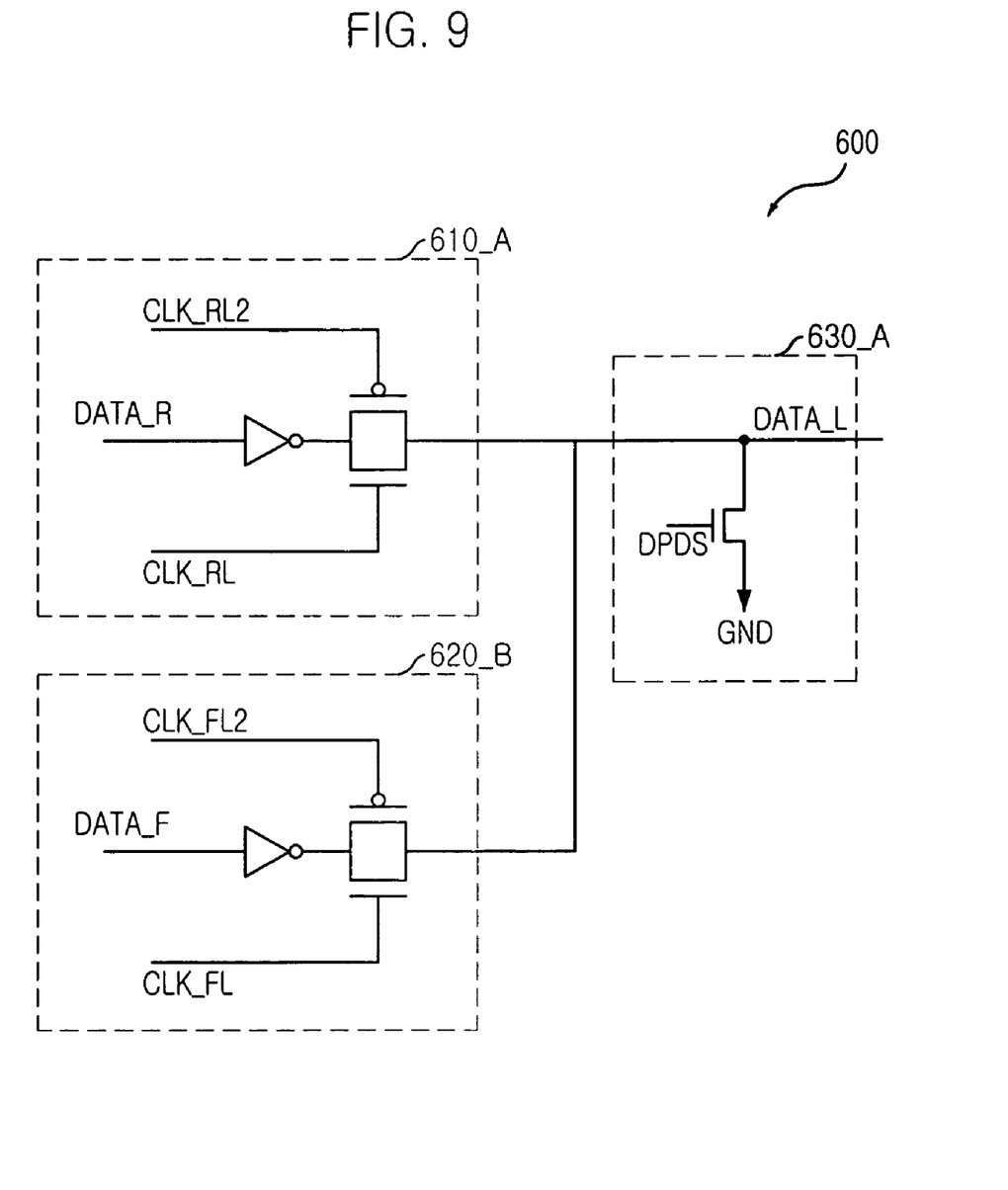
FIG. 9 is a schematic circuit diagram describing a data carrier in accordance with another embodiment of the present invention.

FIG. 9 is a schematic circuit diagram depicting the data carrier 600_A in accordance with another embodiment of the present invention.

As shown, the data carrier 600 is provided with a low voltage rising data transmitting unit 610_A for outputting the rising data DATA_R synchronized with the low voltage rising clock CLK_RL, a low voltage falling data transmitting unit 620_A for outputting the falling data DATA_F synchronized with the low voltage falling clock CLK_FL, and a low voltage initializing unit 630_A.

In an operation of the data carrier 600, the low voltage rising data transmitting unit 610_A inverts the rising data DATA_R to thereby output the low voltage data DATA_L. In other words, when the low voltage rising clock CLK_RL is enabled, the rising data DATA_R is inverted and outputted as the low voltage data DATA_L.

The low voltage falling transmitting unit 620_A inverts the falling data DATA_F to thereby output the low voltage data DATA_L in response to the low voltage falling clock CLK_FL when the low voltage falling clock CLK_FL is enabled.

The low level initializing unit 630_A is substantially identical to 630 in FIG. 8 in a view of structure and function.

Figure 10:
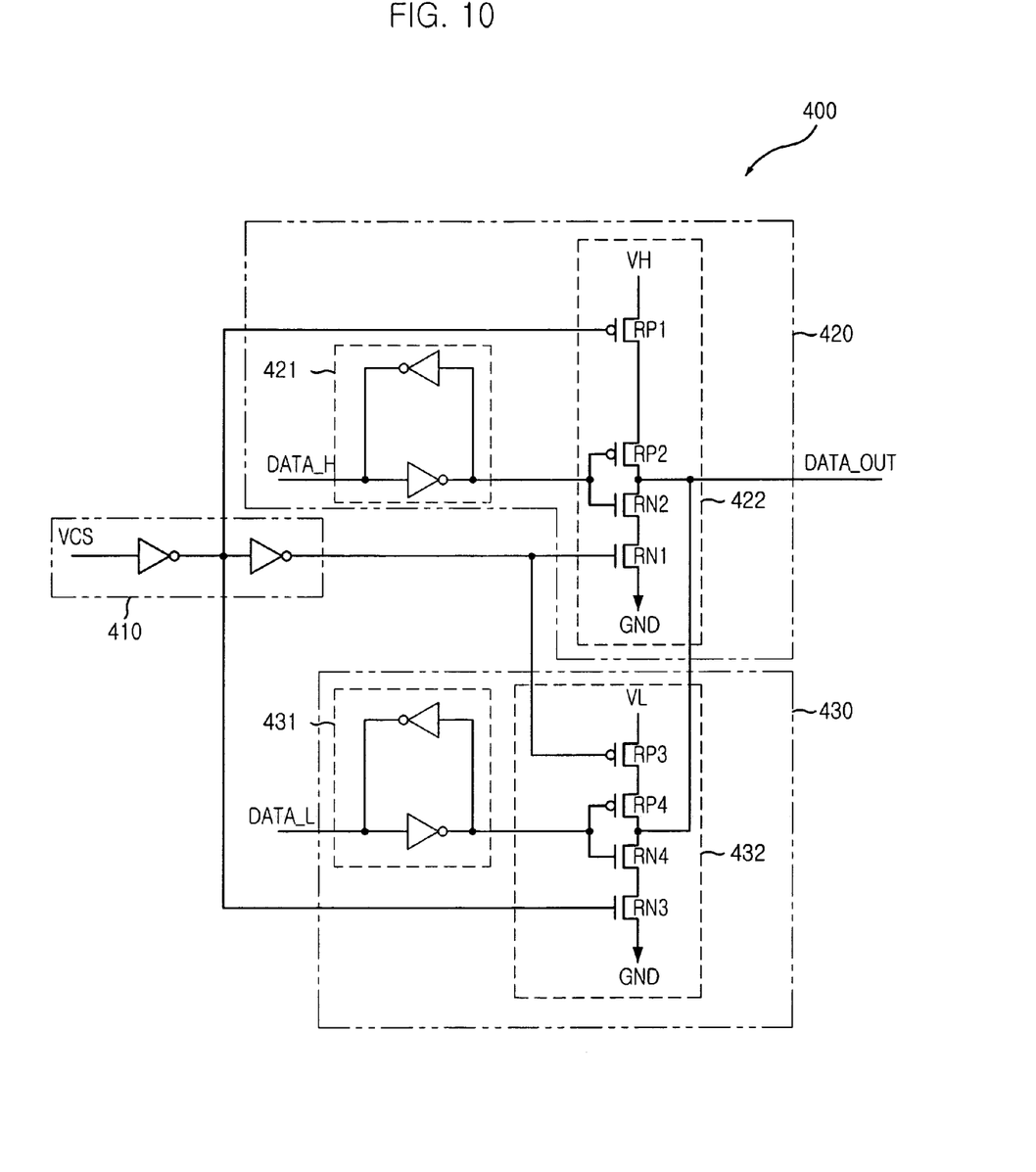
FIG. 10 is a schematic circuit diagram demonstrating a data repeater shown in FIG. 6.

FIG. 10 is a schematic circuit diagram depicting the data repeater 400 shown in FIG. 6.

As shown, the data repeater 400 includes a second voltage level check signal provider 410, a high voltage data repeater 420, and a low voltage data repeater 430.

The high voltage data repeater 420 for outputting a high voltage data DATA_H as an output data DATA_OUT in response to the voltage level check signal VCS is provided with a first latch 421 for inverting and temporarily storing the high voltage data DATA_H and a first inverter 422 for outputting the high voltage data DATA_H as the output data DATA_OUT in response to the voltage level check signal VCS. When a level of the voltage level check signal VCS is a logic level 'H', i.e., when the semiconductor memory device uses a high voltage, a first repeater PMOS transistor RP1 and a first repeater NMOS transistor RN1 are turned-on. Also, when an output data from the first latch 421 is a logic level 'L', a second repeater PMOS transistor RP2 is turned-on to output the high voltage VH. On the contrary, if the output data from the first latch 421 is a logic level 'H', a second repeater NMOS transistor RN2 is turned-on to output the ground voltage GND.

The low voltage data repeater 430 for outputting the low voltage data DATA_L as the output data DATA_OUT in response to the voltage level check signal VCS includes a second latch 431 for inverting and temporarily storing the low voltage data DATA_L and a second inverter 432 for outputting the inverted low voltage data DATA_L in response to the voltage level check signal VCS. When the level of the voltage level check signal VCS is a logic level 'L', in other words, when the semiconductor memory device employs the low voltage VL, a third repeater PMOS transistor RP3 and a third repeater NMOS transistor RN3 are turned-on. Further, if the output data from the second latch 431 is a logic level 'L', a fourth repeater PMOS transistor RP4 turned-on to output the high voltage VH. If the output data from the first latch 431 is a logic level 'H', a fourth repeater NMOS transistor RN4 is turned-on to output the ground voltage GND.

Figure 11:
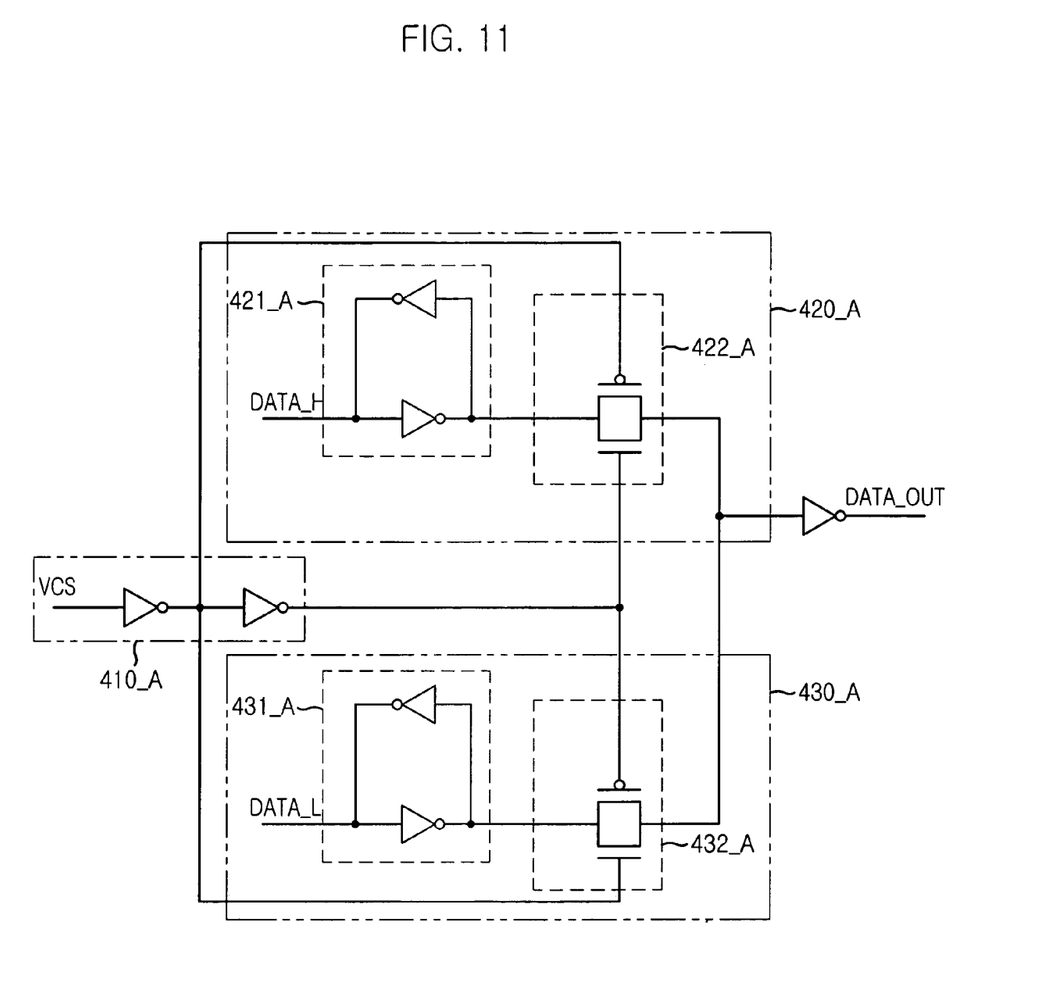
FIG. 11 is a schematic circuit diagram reciting a data repeater in accordance with another embodiment of the present invention.

FIG. 11 is a schematic circuit diagram depicting the data repeater in accordance with another embodiment of the present invention.

As shown, the data repeater 400 includes a second voltage level check signal provider 410_A, a high voltage data repeater 420_A, and a low voltage data repeater 430_A.

The high voltage data repeater 420_A for outputting the high voltage data DATA_H in response to the voltage level check signal VCS is provided with a first latch 421_A for inverting and temporarily storing the high voltage data DATA_H and a first transmit gate 422_A for outputting the inverted high voltage data DATA_H in response to the voltage level check signal VCS. When the level of the voltage level check signal VCS is a logic level 'H', in other words, when the semiconductor memory device uses the high voltage VH, the first transmit gate 422_A is turned-on to output the high voltage data DATA_H as the output data DATA_OUT.

The low voltage data repeater 430_A for outputting the low voltage data DATA_L in response to the voltage level check signal VCS includes a second latch 431_A for inverting and temporarily storing the low level data DATA_L and a second transmit gate 432_A for outputting the low level data DATA_L as the output data DATA_OUT in response to the voltage level check signal VCS. If the level of the voltage level check signal VCS is logic level 'L', the second transmit gate 432_A is turned-on to output the low voltage data DATA_L as the output data DATA_OUT.

As mentioned above, the data output circuit of the present invention is capable of using both the high voltage VH and the low voltage VL without loss of data output speed in one semiconductor memory device.

The present application contains subject matter related to Korean patent application No. 2005-10660, filed in the Korean Patent Office on Feb. 4, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A data output circuit for use in a semiconductor memory device, comprising:
   a clock generating circuit for receiving an external clock to thereby output a high voltage clock and a low voltage clock;
   a level shifter for receiving a data outputted from a core block to thereby output a high voltage data corresponding to the data in response to the high voltage clock;
   a data carrier for receiving the data to thereby output the low voltage data corresponding to the data in response to the low voltage clock; and
   a data repeater for selectively outputting one of the high voltage data and the low voltage data in response to an external voltage level check signal.

2. The data output circuit as recited in claim 1, wherein the data includes a rising data and a falling data.

3. The data output circuit as recited in claim 2, wherein the clock generating circuit includes:
   a clock generator for receiving the external clock to thereby generate a rising clock and a falling clock;
   a clock repeater for receiving the rising clock and the falling clock to thereby selectively output the high voltage clock and the low voltage clock in response to the external voltage level check signal.

4. The data output circuit as recited in claim 3, wherein the clock repeater includes:
   a rising clock repeater receiving the rising clock to thereby selectively output a high voltage rising clock and a low voltage rising clock in response to the external voltage level check signal; and
   a falling clock repeater receiving the falling clock to thereby selectively output a high voltage falling clock and a low voltage falling clock in response to the external voltage level check signal.

5. The data output circuit as recited in claim 4, wherein the rising clock repeater includes:
   a high voltage rising clock repeater for outputting the high voltage rising clock when the external voltage level check signal has a first logic level; and
   a low voltage rising clock repeater for outputting the low voltage rising clock when the external voltage level check signal has a second logic level.

6. The data output circuit as recited in claim 5, wherein the high voltage rising clock repeater includes:
   a first NAND gate receiving the rising clock and the external voltage level check signal;
   a first inverter for inverting an output from the first NAND gate; and
   a switching means for preventing an output from the first inverter from outputting by using an initializing signal for initializing the semiconductor memory device.

7. The data output circuit as recited in claim 6, wherein the low voltage rising clock repeater includes:
   a second inverter for inverting the external voltage level check signal;
   a second NAND gate receiving an output from the second inverter and the rising clock; and
   a third inverter for inverting an output from the second NAND gate.

8. The data output circuit as recited in claim 4, wherein the falling clock repeater includes:
   a high voltage falling clock repeater for outputting the high voltage falling clock when the external voltage level check signal has a first logic level; and
   a low voltage falling clock repeater for outputting the low voltage falling clock when the external voltage level check signal has a second logic level.

9. The data output circuit as recited in claim 8, wherein the high voltage falling clock repeater includes:
   a first NAND gate receiving the falling clock and the external voltage level check signal;
   a first inverter for inverting an output from the first NAND gate; and
   a switching means for preventing an output from the first inverter from outputting by using an initializing signal for initializing the semiconductor memory device.

10. The data output circuit as recited in claim 9, wherein the low voltage falling clock repeater include:
    a second inverter for inverting the external voltage level check signal;
    a second NAND gate receiving an output from the second inverter and the falling clock; and
    a third inverter for inverting an output from the second NAND gate.

11. The data output circuit as recited in claim 3, wherein the data carrier includes:
    a low voltage rising data transmitting means receiving the low voltage rising data to thereby output the low voltage data in response to the low voltage rising clock; and
    a low voltage falling data transmitting means receiving the low voltage falling data to thereby output the low voltage data in response to the low voltage falling clock.

12. The data output circuit as recited in claim 11, wherein the low voltage rising data transmitting means is an inverter receiving the rising data and being switched in response to the low voltage rising clock.

13. The data output circuit as recited in claim 12, wherein the low voltage falling data transmitting means is an inverter receiving the falling data and being switched in response to the low voltage falling clock.

14. The data output circuit as recited in claim 11, wherein the low voltage rising data transmitting means includes:
    an inverter receiving the rising data; and
    a transmission gate for controlling an output from the inverter by being switched in response to the low voltage rising clock.

15. The data output circuit as recited in claim 14, wherein the low voltage falling data transmitting means includes:
    an inverter receiving the falling data; and
    a transmission gate for controlling an output from the inverter by being switched in response to the low voltage falling clock.

16. The data output circuit as recited in claim 2, wherein the data repeater includes:
    a high voltage data repeater for receiving the high voltage data to thereby output the high voltage data as an output data in response to the external voltage level check signal; and
    a low voltage data repeater for receiving the low voltage data to thereby output the low voltage data as the output data in response to the external voltage level check signal.

17. The data output circuit as recited in claim 16, wherein the high voltage data repeater includes:
    a first latch for inverting and temporarily storing the high voltage data; and
    a first inverter for outputting an output from the first latch in response to the external voltage level check signal.

18. The data output circuit as recited in claim 17, wherein the low voltage data repeater includes:
a second latch for inverting and temporarily storing the low voltage data; and
a second inverter for outputting an output from the second latch in response to the external voltage level check signal.

19. The data output circuit as recited in claim 16, wherein the high voltage data repeater includes:
a first latch for inverting and temporarily storing the high voltage data; and
a first transmission gate for outputting an output from the first latch in response to the external voltage level check signal.

20. The data output circuit as recited in claim 19, wherein the low voltage data repeater includes:
a second latch for inverting and temporarily storing the low voltage data; and
a second transmission gate for outputting an output from the second latch in response to the external voltage level check signal.

21. A data output method for use in a semiconductor memory device, comprising:
receiving an external clock to generate a rising clock and a falling clock;
receiving the rising clock and the falling clock to selectively output a high voltage clock and the low voltage clock in response to an external voltage level check signal;
shifting a data outputted from a core block to output a high voltage data and a low voltage data respectively in response to the high voltage clock and the low voltage clock; and
selectively outputting the high voltage data and the low voltage data in response to the external voltage level check signal.

22. The data output method as recited in claim 21, wherein the receiving of the rising clock and the falling clock includes:
selectively outputting a high voltage rising clock and a low voltage rising clock corresponding to the rising clock in response to the external voltage level check signal; and
selectively outputting a high voltage falling clock and a low voltage falling clock corresponding to the falling clock in response to the external voltage level check signal.

23. The data output method as recited in claim 22, wherein the selectively outputting of the high and the low voltage rising clocks includes:
outputting the rising clock as the high voltage rising clock when the external voltage level check signal is a first logic level; and
outputting the rising clock as the low voltage rising clock when the external voltage level check signal is a second logic level.

24. The data output method as recited in claim 22, wherein the selectively outputting of the high and the low voltage falling clocks includes:
outputting the falling clock as the high voltage falling clock when the external voltage level check signal is a first logic level; and
outputting the falling clock as the low voltage falling clock when the external voltage level check signal is a second logic level.

25. The data output method as recited in claim 21, wherein the shifting of the data includes:
outputting the rising data by synchronizing with the low voltage rising clock; and
outputting the falling data by synchronizing with the low voltage falling clock,
wherein the rising data and the falling data are included in the data.

26. The data output method as recited in claim 21, wherein the selectively outputting of the high and low voltage data includes:
outputting the high voltage data in response to the external voltage level check signal; and
outputting the low voltage data in response to the external voltage level check signal.

27. A data output method for a semiconductor memory device, comprising:
receiving an external clock to generate a rising clock and a falling clock;
receiving the rising clock and the falling clock to selectively output a high voltage clock and a low voltage clock in response to an external voltage level check signal; and
outputting the data in response to the high voltage clock and the low voltage clock.

28. The data output method as recited in claim 27, wherein outputting of the data includes:
shifting the data in response to the high voltage clock and the low voltage clock to respectively generate a high voltage data and a low voltage data; and
outputting one of the high voltage data and the low voltage data in response to the external voltage level check signal.

29. The data output method as recited in claim 28, wherein receiving of the rising clock and the falling clock includes:
outputting the rising clock as one of a high voltage rising clock and a low voltage rising clock; and
outputting the falling clock as one of a high voltage falling clock and a low level falling clock.

* * * * *